United States Patent
Wang

(10) Patent No.: US 7,372,734 B2
(45) Date of Patent: May 13, 2008

(54) METHODS OF OPERATING ELECTRICALLY ALTERABLE NON-VOLATILE MEMORY CELL

(76) Inventor: Chih-Hsin Wang, 6585 Gillis Dr., San Jose, CA (US) 95120

(*) Notice: Subject to any disclaimer, the term of this patent is extended or adjusted under 35 U.S.C. 154(b) by 42 days.

(21) Appl. No.: 11/346,816

(22) Filed: Feb. 3, 2006

(65) Prior Publication Data

US 2006/0240613 A1  Oct. 26, 2006

Related U.S. Application Data

(62) Division of application No. 10/919,555, filed on Aug. 16, 2004, now Pat. No. 7,098,499.

(51) Int. Cl.
*G11C 11/34* (2006.01)
(52) U.S. Cl. .................. 365/185.14; 365/185.19; 257/374; 257/397
(58) Field of Classification Search ........... 365/185.14, 365/185.29; 257/374, 397
See application file for complete search history.

(56) References Cited

U.S. PATENT DOCUMENTS

| | | | |
|---|---|---|---|
| 5,465,231 A | 11/1995 | Ohsaki | |
| 5,604,700 A | 2/1997 | Parris et al. | |
| 5,736,764 A * | 4/1998 | Chang | 257/318 |
| 6,282,123 B1 * | 8/2001 | Mehta | 365/185.28 |
| 6,294,809 B1 * | 9/2001 | Logie | 257/320 |
| 6,570,212 B1 * | 5/2003 | Mehta et al. | 257/315 |
| 6,580,642 B1 * | 6/2003 | Wang | 365/185.18 |
| 6,617,637 B1 * | 9/2003 | Hsu et al. | 257/315 |
| 6,819,594 B2 * | 11/2004 | Lee et al. | 365/185.18 |
| 7,098,499 B2 * | 8/2006 | Wang | 257/302 |
| 2004/0061168 A1 | 4/2004 | Cappelletti et al. | |
| 2004/0109364 A1 | 6/2004 | Yang | |
| 2004/0109380 A1 | 6/2004 | Yang | |
| 2005/0199936 A1 * | 9/2005 | Wang et al. | 257/314 |

OTHER PUBLICATIONS

K. Naruke et al., "Stress Induced Leakage Current Limiting to Scal Down EEPROM Tunnel Oxide Thickness", IEDM Technical Digest, p. 424-427, 1988.
C. Diorio, "A p-Channel MOS Synapse Transistor with Slef-Convergent memory Writes", IEEE Trans. on Electron Devices, vol. 47, pp. 464-472, 2000.

* cited by examiner

*Primary Examiner*—Huan Hoang
*Assistant Examiner*—Anthan T Tran

(57) ABSTRACT

A nonvolatile memory cell is provided. The memory cell includes a storage transistor and an injector in a well of an n-type conductivity. The well is formed in a semiconductor substrate of a p-type conductivity. The storage transistor comprises a source, a drain, a channel, and a charge storage region. The source and the drain are formed in the well and having the p-type conductivity with the channel of the well defined therebetween. The charge storage region is disposed over and insulated from the channel region by an insulator. Further provided are methods operating the memory cell, including means for injecting electrons from the channel through the insulator onto the charge storage region and means for injecting holes from the injector through the well through the channel through the insulator onto the charge storage region. The memory cell can be implemented in a conventional logic CMOS process.

23 Claims, 9 Drawing Sheets

METHODS OF OPERATING ELECTRICALLY ALTERABLE NON-VOLATILE MEMORY CELL

RELATED APPLICATIONS

This application is a Divisional of U.S. patent application Ser. No. 10/919,555 ("parent application") filed on Aug. 16, 2004 now U.S. Pat. No. 7,098,499, entitled "ELECTRICALLY ALTERABLE NON-VOLATILE MEMORY CELL".

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to memory cell structure and method altering charge state of memory cells by employing mechanism injecting holes onto floating gate or charge storage sites of non-volatile memory cells for erase operation.

BACKGROUND OF THE INVENTION

Non-volatile semiconductor memory cells permitting charge storage capability are well known in the art. The charges stored thereon define the states of a memory cell. Typically, the states can be either two levels or more than two levels (for multi-level states storage). In terms of charge storage scheme, in general, the memory cells can be divided into two main categories. The first type of memory uses a conductive or semiconductor region as the storage site. The storage site is electrically insulated from but capacitively coupled to surrounding electrodes through a storage insulator. Charges stored in such memory are evenly distributed through out the conductive region. Memory cells with such type of charge storage scheme are commonly referred as "floating-gate" type of cells. Typically, such floating gate memory cells have been of the single-gate type, split-gate type, or stack-gate type, or a combination thereof.

The second type of memory stores charges in a plurality of discrete storage sites, such as trapping centers of an appropriate dielectric material ("trapping dielectric"). The storage sites in the trapping dielectric is electrically insulated from but capacitively coupled to surrounding electrodes through a storage insulator. The Memory cells employing such type of storage scheme are commonly referred as "charge-trapping" memory cells. The storage sites can be also in nano-crystal form, and the memory cells employing such type of storage scheme are commonly referred as "nano-crystal" memory cells. These memory cells do not require a floating-gate. Therefore, it provides advantages over the floating-gate memory cells in area such as negligible interference between adjacent cells, and reduced process complexity. Furthermore, the charges in such memory cell can be stored at localized sites (traps or nano-crystals). Therefore it also has the advantage that in the event there is a local breakdown in the storage dielectric or in surrounding dielectrics, charges stored at other sites can still be retained.

Single-gate memory has the advantages over other types of memory cells on a simpler process in manufacturing such type of memory cell. This type of memory can potentially be manufactured in process as simple as a conventional CMOS, thus can be manufactured with low cost and can be easily embedded in CMOS logic products. Such non-volatile memory cell has been proposed in U.S. published application Ser. Nos. 2004/0109364 A1, 2004/0109380 A1, in U.S. Pat. No. 6,617,637, and in U.S. published application Ser. No. 2004/0061168 A1, which are hereby incorporated by reference. As will be described hereinafter, there are several disadvantages in the disclosures of prior arts. The present invention provides cell structures and operation method with advantages over the prior arts.

The present invention can best be understood with an understanding of how the memory cells in prior arts are constructed and how they are operated for program and erase operations. Thus a short introduction is presented to describe the prior art cell structure, and the cell operations.

U.S. published application Ser. Nos. 2004/0109364 A1 and 2004/0109380 A1 taught memory cell structure and operation method (e.g. program and erase). Illustrated in FIG. 1 is a cross sectional view for cell structure 100 of the prior art. The cell 100 comprises a first and a second p-type metal-oxide semiconductor field-effect-transistors (p-FETs 10 and 12) formed in an n-type of Well 14 (n-Well). Both p-FETs 10 and 12 are connected in series by a shared region 16 with the gate of the first p-FET 10 functioning as a select gate (SG 18), and gate of the second p-FET 12 functioning as a floating-gate (FG 20) for storing charge carriers. A source region 22 of the first p-FET is connected to a source-line with a source-line voltage 24 applied thereto. Similarly, a drain region 26 of the second p-FET is connected to a bit-line with a bit-line voltage 28 applied thereto. The SG 18 of the memory cell 100 is connected to a select-gate voltage 30 of appropriate voltages during cell operations. The cells are electrically programmed by heating up channel holes 32 through which impacted channel hot electrons 34 (ICHE) are created and injected into the floating gate 20. For re-programmability, the cell need be erased by application of ultraviolet 36 (UV) light treatment. Therefore, the cells are used in devices typically known as EPROM devices well-known in the art. During cell operation (e.g. program and read), the n-Well 14 is biased at a voltage different than ground voltage. Therefore, though not shown in the prior art, the n-Well 14 need be formed in a p-type Well or a p-type substrate. Such type of memory cells can be manufactured in a conventional CMOS process having an n-Well in a p-type semiconductor substrate (Sub). However, erasing such cells requires erasure of the entire memory device by application of UV light even erase is made for changing the content of only a single byte. The memory device has to be removed from the circuit board in order to perform UV treatment for the erase operation. The process is tedious and adds inconvenience in product applications.

U.S. Pat. No. 6,617,637 taught an electrically erasable and programmable memory (EEPROM) cell structure and operation method, and is hereby incorporated by reference. The cell comprises a structure similar to the one in FIG. 1 except that the drain next to the floating gate comprises a heavily doped n-type region (n+ region) formed in a lightly doped p-type region (p– region). The cell is programmed by injecting ICHE into floating gate and erased by Band-to-Band-Tunneling (BTBT) injection of holes into the floating gate. The cell structure and operation method require the p– region having a metallurgical junction depth deeper than that of the n+ region and yet shallower than that of the n-Well, in order to isolate the n+region from the n-Well. The needs on a shallower p– region (or equivalently a deeper n-Well region) prohibit this memory cell from being implemented in the conventional CMOS process, as neither of these regions is available in the base-line process of conventional CMOS.

U.S. Pat. No. 5,736,764 taught an electrically erasable and programmable memory (EEPROM) cell structure and operation method, and is hereby incorporated by reference. The cell comprises a p-FET-based cell structure similar to the one in FIG. 1 except that a control gate is added in the cell structure for operating the cell. The cell is programmed by injecting ICHE onto floating gate and erased by removing electrons from floating gate through Fowler-Nordheim tunneling mechanism. The control gate is essential for the cell operation and comprises a p-type diffusion layer. The memory cell is electrical erasable and thus has the advantage over cells in U.S. application Ser. Nos. 2004/0109364 A1 and 2004/0109380 A1. However, the p-type diffusion layer has to be disposed under a portion of the floating gate in order to effectively perform the control gate function. Such kind of p-type diffusion is unavailable in the conventional CMOS process, thus the cell structure cannot be realized in the conventional CMOS. Further, the control gate occupies a large portion of the cell area thus unavoidably enlarges the cell size.

U.S. published application Ser. No. 2004/0061168 A1 taught an electrically erasable and programmable memory (EEPROM) cell structure 200 and operation method. The cell is illustrated in n-FET based architecture, and is programmed by substrate hot electron injection (SHEI) and erased by Fowler-Nordheim tunneling. The cell structure comprises a floating gate, and two separated p-Wells with a first p-Well having a pair of n-type FETs (n-FETs) connected in series and a second p-Well having an n-FET. Illustrated in FIGS. 2A and 2B (prior art) are cross sectional view of a cut-plane along line BB in FIG. 3*a* of the prior art for the program and the erase operations, respectively. Referring to FIG. 2A, the floating gate 40 is disposed over and insulated from the first p-Well 42 and the second p-Wells 44 by an insulator 46. A n+ region 48 formed in the second p-Well 44 functions as a control gate of the memory cell 200 to allow charge carriers be added onto or removed from the portion of floating gate 40 that is disposed over the first p-Well 42. The bias condition shown in FIG. 2A permit substrate electrons 49 be heated up to transport through the n-channel layer 50 and be injected into the floating gate 40 along a trajectory 51 to perform a program operation on the memory cell. FIG. 2B is a similar cross sectional view as in FIG. 2A except bias condition is set for the erase operation. A voltage in the range of about 10V is applied across the insulator 46 between floating gate 40 and the $1^{st}$ p-Well 42 (−5V applied at the control gate 48 and the second p-Well 44, and +5 V applied to the $1^{st}$ p-Well 42). The bias and the cell structure permits electrons 52 in FG 40 be removed along the trajectory 53 shown in dash line. Notably, to support erase operation, both p-Wells are isolated from a p-substrate 54 by a deeper n-Well (deep n-Well 56) having a well depth deeper than the p-Wells 42 and 44 in order to avoid forward-biasing any p-Well during the erase operation of the cell 200. The memory cell 200 is electrical erasable and thus has the advantage over cells in U.S. application Ser. Nos. 2004/0109364 A1 and 2004/0109380 A1. However, the requirement on isolated p-Wells from the substrate prohibits this memory cell from being implemented in the conventional CMOS process, where the deep n-Well 56 is not available. Additionally, the requirement on a control gate 48 for operating the cell requires the second p-Well 44 be an isolation well (to isolate the control gate 48 from the deep n-Well 56). Therefore, it unavoidably enlarges the cell size. This issue is worse when a Well region is involved (due to the looser design rule for Well-to-Well spacing than other rules). It is noted that the memory cell can be configured to a p-FET based cell by replacing the n-FETs with p-FETs, and by proper changing the Well type to an opposite one. Specifically, in such case, the cell can comprise two n-Wells isolated by a deep p-Well in an n-type substrate. Nevertheless, the forgoing issues on larger cell size and on incompatibility with the conventional CMOS process remain be the main disadvantages of such cell.

As described hereinbefore, the memory cells in U.S. Pat. No. 5,736,764 and U.S. application Ser. No. 2004/0061168 A1 are erased by Fowler-Nordheim tunneling mechanism. Similar technique has been widely employed in other types of single-gate memory cells (for example, U.S. Pat. Nos. 5,604,700, and 5,465,231). In erasing these types of non-volatile memories with such mechanism, a large voltage drop (typically ranging from 9 to 20V) across the storage insulator is required to perform the operation in order to set a desired logic states (e.g. a "0" state) to the memory. Employing Fowler-Nordheim tunneling mechanism to erase these types of memory cells unavoidably introduces stress field in the range of about 10 MV/cm to the storage insulator, which isolates the floating gate or the storage sites from surrounding conductive regions. This high field stress effect on the storage insulator results in charge leakage and retention failure even when memory cells are under a low field condition. This effect is known as the Stress Induced Leakage Current (SILC), and has been shown being the dominant leakage mechanism causing retention failure in non-volatile memory industry (see K. Naruke et al, "Stress Induced Leakage Current Limiting to Scale Down EEPROM Tunnel Oxide Thickness", IEDM Technical Digest, pp. 424-427, 1988.). Therefore, the memory cell disclosed in U.S. published application Ser. No. 2004/0061168 A1 is believed suffered from high field induced SILC issue.

The present invention provides cell structure and operation method of a single poly electrical erasable programmable memory cell that can be fabricated in the conventional CMOS process. The erase operation of the present cell permits the voltage drop across the storage insulator be confined in range less than about 2 V. Therefore, it avoids the high field stress on the insulator and hence the SILC issue. Other advantages, objects and features of the present invention will become apparent by a review of the specification, claims and appended figures.

DISCLOSURE OF THE INVENTION

It is the object of the invention to provide an improved electrically alterable memory cell and operation methods.

Briefly, a preferred embodiment of the present invention is a nonvolatile memory device. A substrate of a semiconductor material is provided having a p-type conductivity. A well in the substrate is provided having an n-type conductivity. A storage transistor having a source and a drain of p-type conductivity is formed in the well. A channel in the well is created in between the source and the drain. A charge storage region is disposed over and insulated from the channel region by an insulator. An injector having a p-type region in the well is formed next to and isolated from the channel. The injector permits hole carriers be injected into the well, transporting through the channel through the insulator onto the charge storage region.

Briefly, another preferred embodiment of the present invention is a method operating the nonvolatile memory device. The method comprises the steps of applying a first voltage to the p-type region of the injector, applying a second voltage to the well, and applying a third voltage to at least one of the source and the drain to form an inversion layer in the channel. The first voltage is sufficiently more positive with respect to the second voltage and the second voltage is sufficiently more positive with respect to the third voltage to inject holes from the injector through the well through the channel through the insulator onto the charge storage region.

Briefly, another preferred embodiment of the present invention is methods programming and erasing the nonvolatile memory device. The method of programming the memory cell comprises the steps of applying a first voltage to the well, applying a second voltage to the source, and applying a third voltage to the drain. The third voltage is sufficiently more negative with respect to the first voltage to inject electrons from the channel through the insulator onto the charge storage region. The method of erasing the memory cell comprises the steps of applying a fourth voltage to the p-type region of the injector, applying a fifth voltage to the well, and applying a sixth voltage to at least one of the source and the drain to form an inversion layer in the channel. The fourth voltage is sufficiently more positive with respect to the fifth voltage and the fifth voltage is sufficiently more positive with respect to the sixth voltage to inject holes from the injector through the well through the channel through the insulator onto the charge storage region.

Briefly, another preferred embodiment of the present invention is an electrically erasable and programmable nonvolatile memory array. The array comprises a substrate of semiconductor material of a p-type conductivity, a well of an n-type conductivity in the substrate, and a plurality of nonvolatile memory cells arranged in a rectangular array of rows and columns. Each of the plurality of nonvolatile memory cells comprises a storage transistor having a source and a drain of the p-type conductivity formed in the well with a channel of the well defined therebetween, and a charge storage region disposed over and insulated from the channel by an insulator. Each of the memory cells further comprises an injector having a p-type region formed in the well.

These and other objects and advantages of the present invention will become clear to those skilled in the art in view of the description of the preferred embodiment as described herein and as illustrated in the figures of the drawings.

BRIEF DESCRIPTION OF THE DRAWINGS

The invention is herein described, by ways of example only, with reference to accompanying drawings, wherein FIG. 1 (prior art) illustrates a cross sectional view of the EPROM memory cell architecture of the prior art.

DETAILED DESCRIPTION OF THE INVENTION

The Memory Cell of the Present Invention

Figure 1:
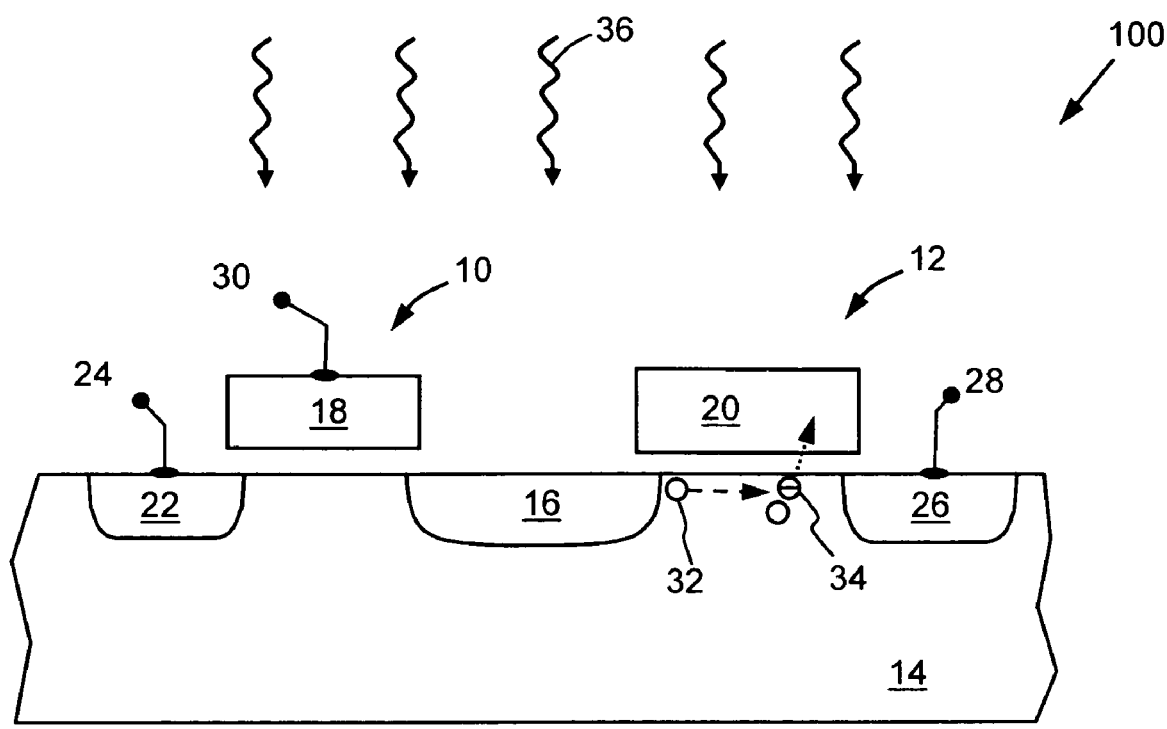
Figure 2A:
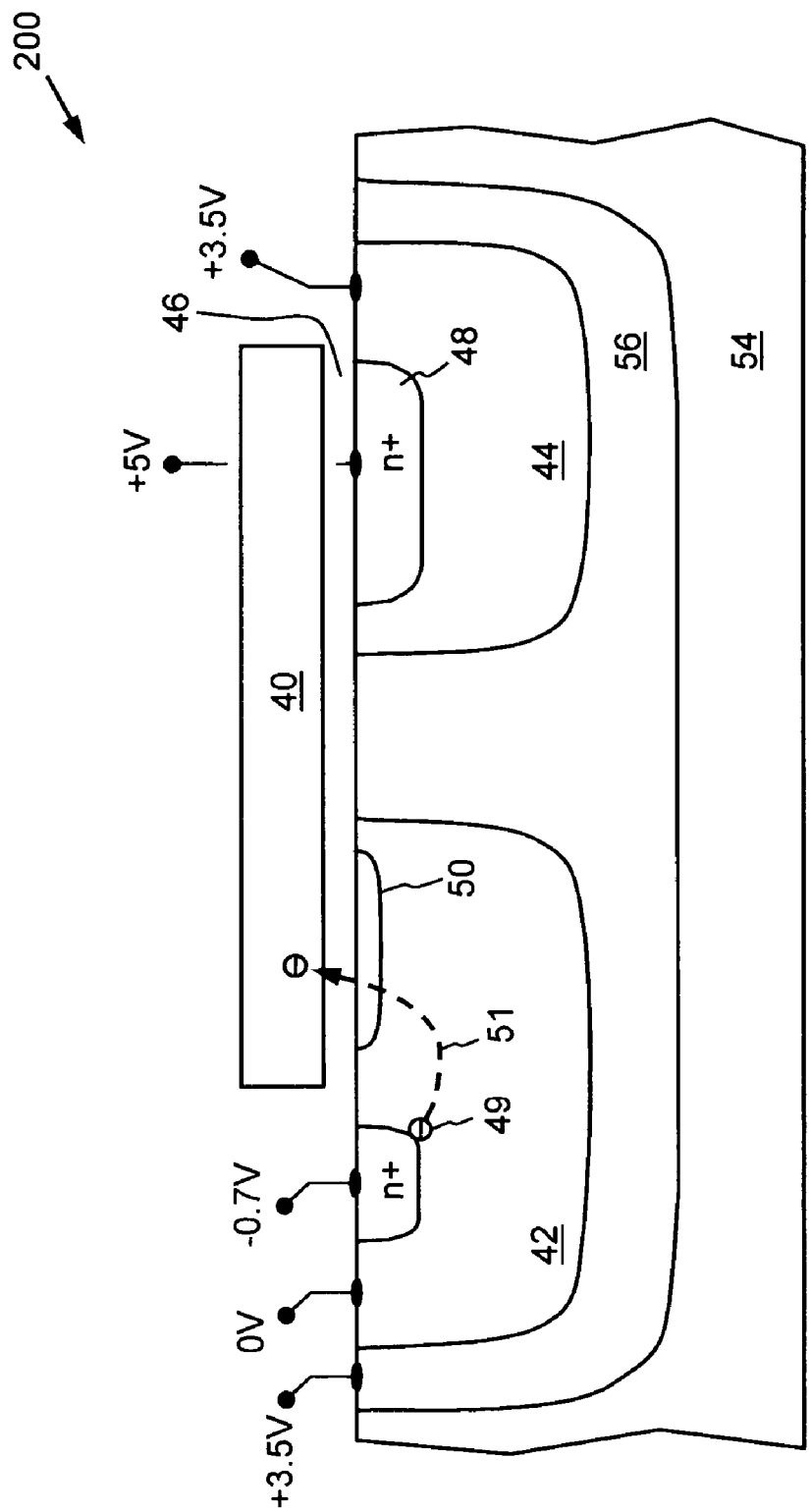
FIG. 2A (prior art) is a cross sectional view illustrating the EEPROM memory cell architecture of the prior art, and further illustrating the trajectory of the hot electrons and bias conditions for program operation.
Figure 2B:
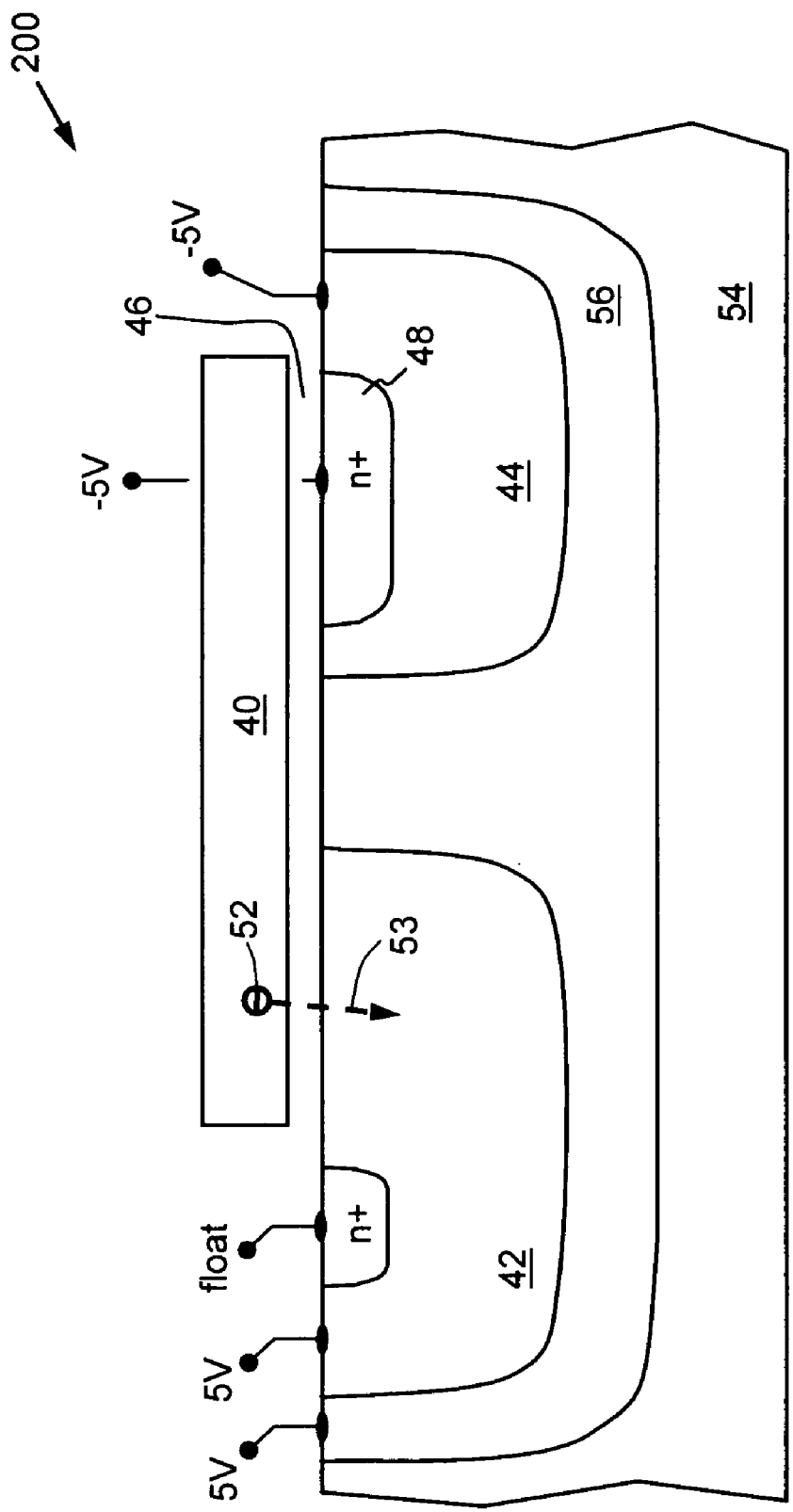
FIG. 2B (prior art) is a cross sectional view illustrating the EEPROM memory cell architecture of the prior art, and further illustrating the trajectory of the electrons movement and bias conditions for erase operation.
Figure 3:
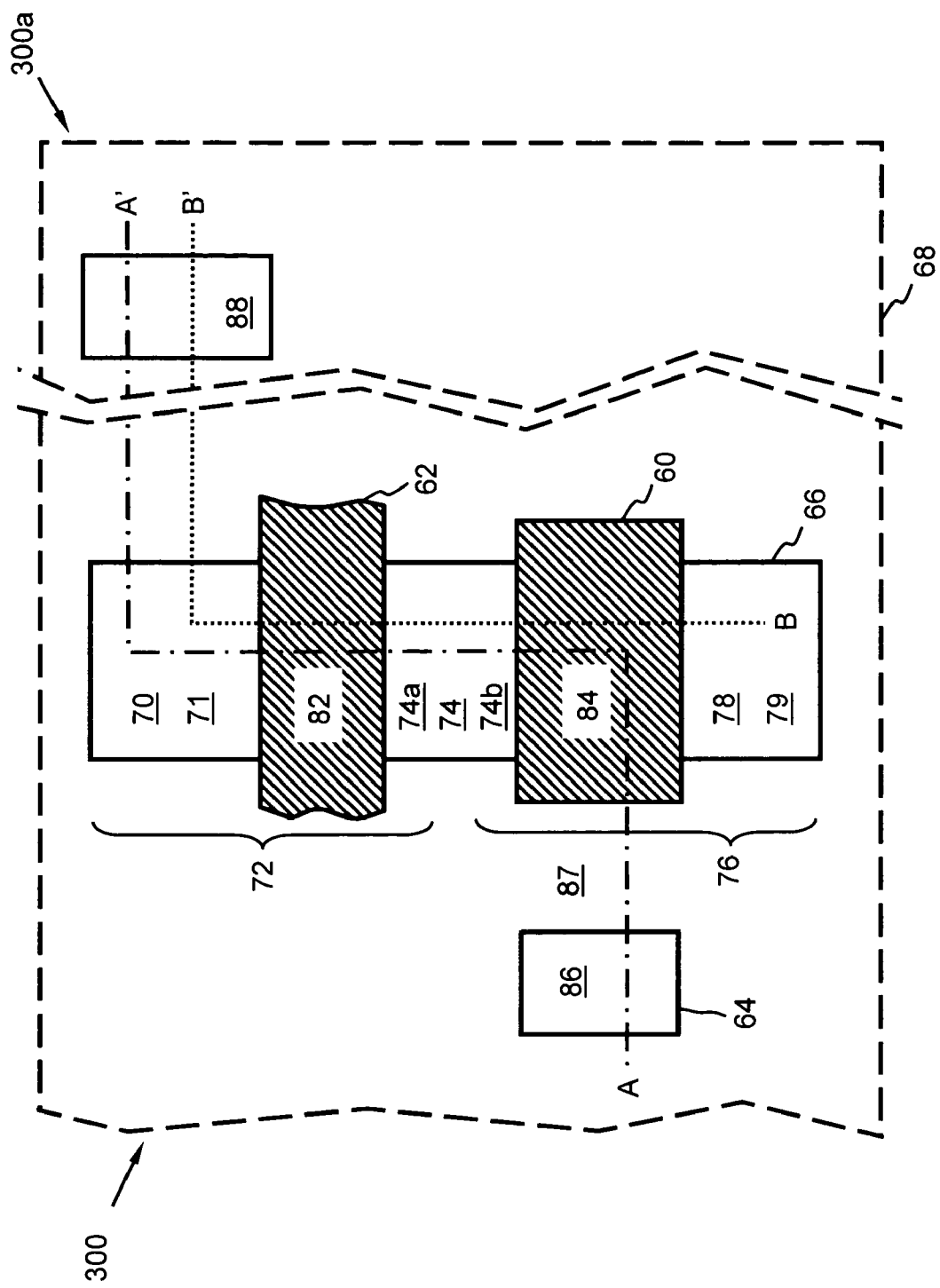
FIG. 3 is a top view illustrating the layout of a memory cell of the present invention and of an n+ diffusion region of the n-Well tap.

FIG. 3 illustrates a layout of memory cell 300 of the present invention. The layout of cell 300 in FIG. 3 comprises a floating gate (FG 60), a select gate (SG 62), an injector 64, and a first diffusion 66 in an n-Well 68. The first diffusion 66 overlaps with and divided by the FG 60 and SG 62 into 3 heavily doped p-type regions (hereinafter "p+ regions"), wherein a first p+ region 70 next to SG 62 defines drain 71 of a SG-FET 72, and is metal connected to a bit line (BL) of the cell 300. A second p+ region 74 divided by SG 62 and FG 60 is illustrated as a common region shared by the SG-FET 72 and a FG-FET 76. It defines the source 74a of the SG-FET 72 or the drain 74b of the FG-FET 76. A third p+ region 78 next to FG 60 defines the source 79 of the FG-FET 76, and is connected to a source line (SL) of the cell 300. The overlapping region between SG 62 and the first diffusion 66 defines a channel 82 of the SG-FET 72. Likewise, the overlapping region between FG 60 and the first diffusion 66 define a channel 84 of the FG-FET 76. Both channels 82 and 84 have a channel width along the horizontal direction and a channel length along the vertical direction of the layout in FIG. 3. The injector 64 comprises a p+ region 86 in the n-Well 68, and is disposed adjacent to and isolated from the channel 84 of FG-FET 76 by an isolation region 87 typically made of a field oxide. The isolation region 87 can be a region formed by LOCOS or Shallow Trench Isolation (STI) techniques well-known in the art. Also shown in FIG. 3 is an n-Well tap 300a comprising a heavily doped n-type diffusion 88 ("n+ diffusion") in the n-Well 68 and functions as a tap of the n-Well 68.

Figure 4A:
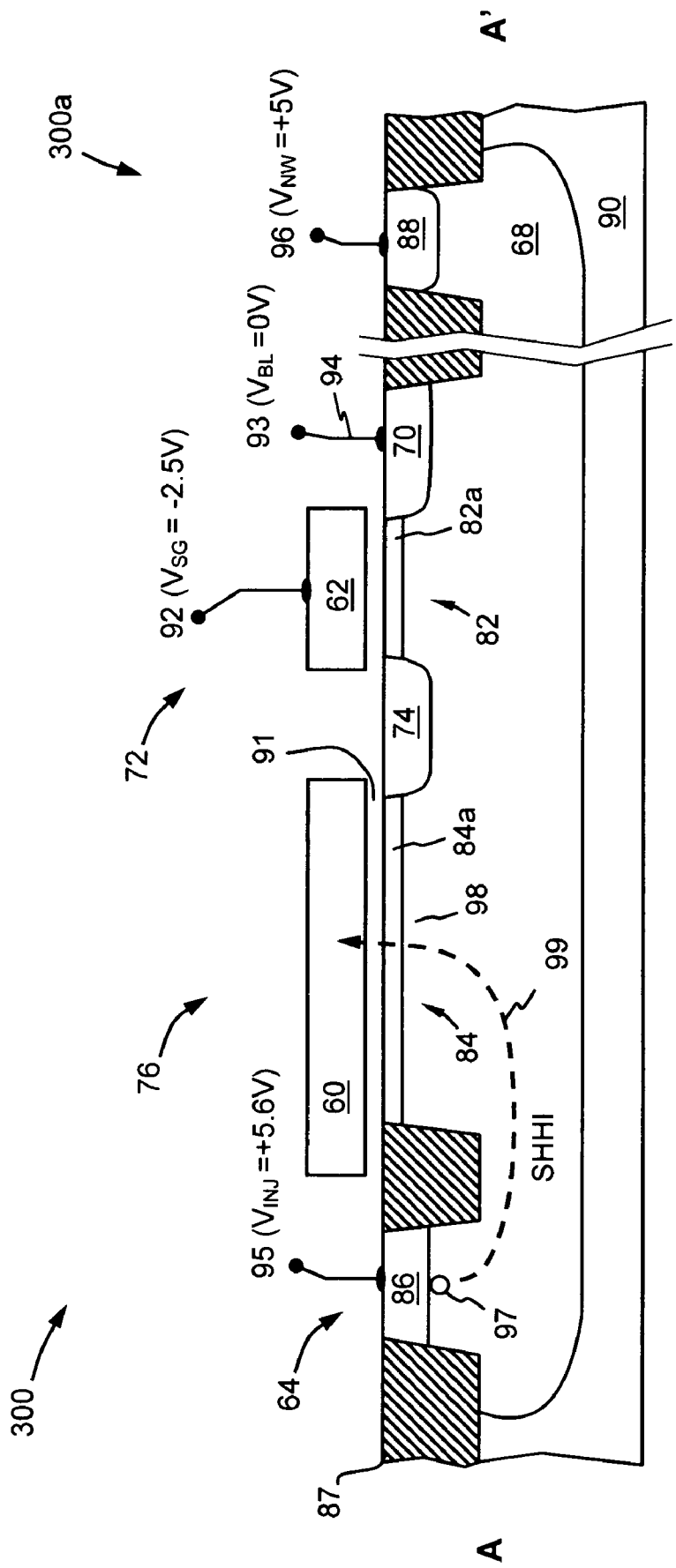
FIG. 4A is a cross sectional view along line AA' in FIG. 3 to illustrate the EEPROM memory cell architecture of the present invention, and further to illustrate the trajectory of the holes movement and the bias conditions for erase operation.
Figure 4B:
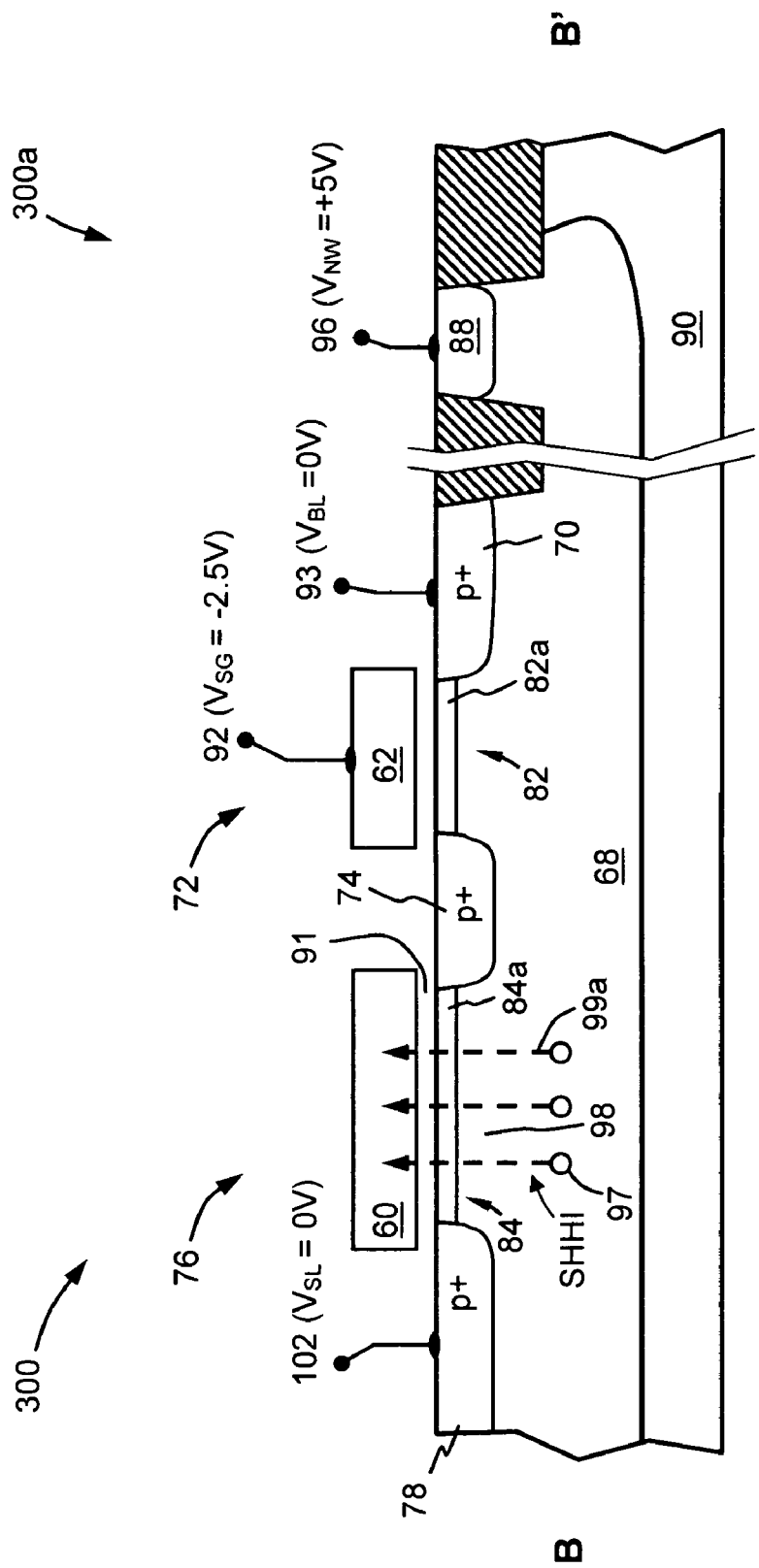
FIG. 4B is a cross sectional view along line BB' in FIG. 3 to illustrate the EEPROM memory cell architecture of the present invention, and further to illustrate the trajectory of the holes movement and the bias conditions for erase operation.

The key aspect of the present invention lies in the manner in which the memory cell is erased. Rather than erasing memory cell with techniques in the prior art (e.g. Fowler-Nordheim mechanism or with BTBT mechanism), the cell of present invention is erased by employing the Substrate Hot Hole Injection (SHHI) mechanism. FIGS. 4A and 4B illustrate the cross sectional view on cut-planes along line AA' and line BB' in FIG. 3, respectively, for the erase operation of the present invention. Also illustrated is an example on the bias conditions of the operation. Referring to FIG. 4A, there is shown a cross sectional view of the cell 300 and the n-Well tap 300a. Shown in the n-Well tap 300a is the n+ diffusion 88 tapping to the n-Well 68. Shown in the cell portion 300 is an n-Well 68 in a p-type silicon substrate 90 with the floating gate 60 and the select gate 62 disposed over and insulated therefrom by an insulator 91 of a thickness in the range of about 50 Å to 200 Å. The n-Well 68 also functions as a body region of the SG- and FG-FETs 72/76. Also shown are the cross sectional view for the first and the second p+ regions 70/74. In the n-Well 68, there are a first and a second p-type inversion layers (p-Inversion layers 82a/84a) formed in the channel regions 82/84 of the SG-FET 72 and FG-FET 76, respectively. The first p-Inversion layer 82a is formed by applying a select gate voltage ($V_{SG}$ 92) at SG 62 that is lower than a Bit Line voltage ($V_{BL}$ 93) at BL 94 by at least a threshold voltage $V_T$ of the SG-FET 72. The SG-FET 72 thus is in an "ON" state to pass the $V_{BL}$ 93 to the second p+ region 74. The second p-Inversion layer 84a is formed while the FG 60 is negatively charged with electron carriers. Usually, this happens after the cell 300 is programmed to a program state. The presence of the second p-Inversion layer 84a can be maintained as long as the floating gate voltage ($V_{FG}$) is lower than that of the second and the third p+ regions 74/78 (shown in FIG. 4B) by about a $V_T$ of the FG-FET 76. The second p-Inversion 84a is electrically connected to these p+ regions 74/78, and therefore it also serves as an electrical extension of these regions. The potential at the silicon surface (hereinafter "surface potential") in the p-Inversion region 84a thus can be set by these p+ regions. Also shown in FIG. 4A is the injector 64 disposed adjacent to the FG channel 84. The injector 64 is forward biased at an injector voltage ($V_{INJ}$ 95) in the range of about +0.6 V higher relative to the n-Well voltage ($V_{NW}$ 96) to supply hole carriers 97 for SHHI. After hole carriers being injected into n-Well 68 by the injector 64, they transport through diffusion process due to their concentration gradient in the n-Well 68. A portion of them make their way reaching a space charge region (SCR 98) formed under the second p-Inversion layer 84a and be accelerated by an electrical field in that region to transport along a direction vertical to the silicon surface toward FG 60. Some of them gain enough energy to surmount the hole barrier height $\Phi_{VB}$ between the insulator 91 and the n-Well silicon 68, making their way entering into FG region 60 and stored therein. A trajectory 99 on the hole movement is shown in FIG. 4A to illustrate this effect.

The SHHI mechanism can be viewed from a different cross sectional view than in FIG. 4A by referring to FIG. 4B. In FIG. 4B, there is shown the FG-FET 76 connected in series with the SG-FET 72 with both of them disposed in the n-Well 68. Further, there is shown the second p-Inversion 84a being electrically connected to both the second and the third p+ regions 74/78. In prior art, U.S. Pat. No. 6,617,637, the direction of the acceleration field for heating up hole carriers is along the substrate surface, and is different from the direction for hole injection, which is along a vertical direction to the substrate surface. Different from the prior art, as shown in FIG. 4B, the present invention provides a cell structure and an erase method that can align the direction of the acceleration field to the injection direction. In other words, hole carriers 97 in FIG. 4B are "aimed" directly at FG 60 while being accelerated in the electric field of SCR 98. Therefore, the injection efficiency can be much higher than that in the prior art. The injection efficiency for erase method of the present invention is estimated to be in the range of about 10 per millions to about 100 per millions. Here, the term "injection efficiency" is defined as the ratio of the number of hole carriers entering into FG 60 to the number of hole carriers arriving the p-Inversion layer 84a.

Criteria on SHHI and its implications to the selection on FETs of cell 300 and to the memory operation of the present invention are provided herein by referring to FIG. 4B. In the erase operation of the present invention, a source line voltage 102 ($V_{SL}$) at the third p+ region 78 is set at a voltage level identical to $V_{BL}$ 93 at the first p+ region 70. Therefore, the voltage of the second p-Inversion 84a equals $V_{SL}$ 102 and $V_{BL}$ 93, which is typically at about 0 V. $V_{NW}$ 96 in together with the voltage of the second p-Inversion layer 84a determines the strength of the electric field in SCR 98. The maximum energy $E_h$ that hole carriers can acquire in the electric field equals the surface band bending potential $\phi_S$ in the SCR 98 multiplied by the electron unit charge q. Here, the surface band bending potential $\phi_S$ is defined as the difference between potential at substrate surface and at region away from the surface where there is negligible band bending. The maximum energy $E_h$ can be expressed to first order in following expression:

$$E_h = q\phi_S = q^*[|V_{NW-SL}| + 2|\phi_F|],$$

where $V_{NW-SL} = V_{NW} - V_{SL}$, and $\phi_F$ is expressed as $$\phi_F = kT/q^* \ln(N_{DD}/n_i);$$

k is plank constant;
T is absolute temperature;
$N_{DD}$ is the concentration of donor impurities in n-Well; and
$n_i$ is the intrinsic carrier concentration of the silicon.

Therefore, to permit holes to transport into the FG 60 region, a proper voltage on $V_{NW}$ 96 and $V_{SL}$ 102 need be applied such that a first criterion of $E_h > \Phi_{VB}$ is met. Assuming the insulator 91 is an oxide. The barrier height between oxide and Si is about 4.7 eV for hole. Therefore, a voltage drop between n-Well and the third p+ region 78 (i.e. SL) in the range of about 4 V to 5 V can provide adequate energy supporting SHHI for the erase operation, assuming $N_{DD}$ is at a level of about $1 \times 10^{17}$ cm$^{-3}$.

Figure 5A:
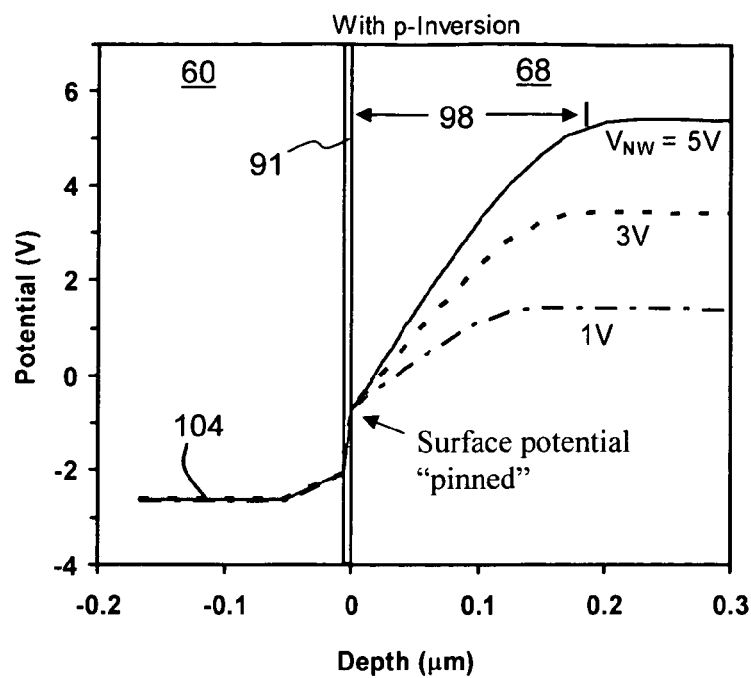
FIGS. 5A and 5B illustrate the potential along the trajectory of hole movement in FIG. 4B for cell with and without the p-Inversion in the channel of FG-FET, respectively.
Figure 5B:
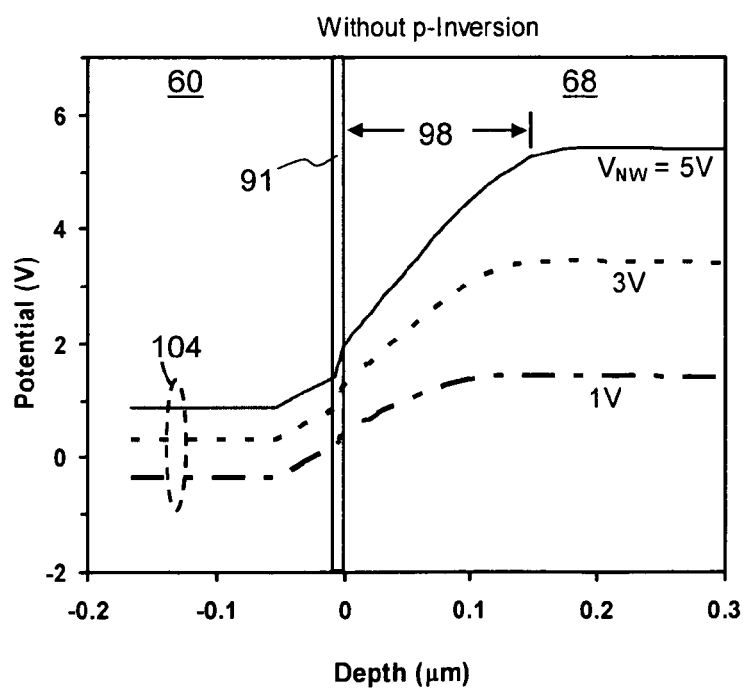

The above condition is valid only if the second p-Inversion layer 84a can be maintained in presence to effectively "pin" the surface potential at a level set by $V_{SL}$ 102. This effect can be better described by referring to FIGS. 5A and 5B for situations with and without the p-Inversion layer 84a, respectively. Illustrated in FIG. 5A is a simulation result on potentials along the trajectory 99a of hole transport shown in FIG. 4B for n-Well 68 biased at various voltages $V_{NW}$ 96. Referring to FIG. 5A, the depth at 0 μm corresponds to the surface of the n-Well 68 in the silicon substrate, where a surface potential is defined thereat. It is shown that the surface potentials are effectively "pinned" at a same level (at about −0.8 V) by the p-Inversion layer regardless of the levels on $V_{NW}$ 96. Furthermore, the p-Inversion completely shields the n-Well potential from penetrating into the FG region. This result in the floating gate potential $V_{FG}$ 104 being independent of the levels of $V_{NW}$ 96. Thus any increment on $V_{NW}$ 96 is reflected in the increment on band bending of the potential in SCR 98, and hence on the acceleration field for SHHI. Similar results for the situation without the p-Inversion 84a in the channel is illustrated in FIG. 5B. Referring to FIG. 5B, there is shown the surface potentials increases from about 0.4 V to about 2 V as increasing n-Well voltage from 1 V to 5 V. As a result, the degree on band bending of the surface potential is much weaker than that when the p-Inversion layer 84a is in presence. The weaker band bending cannot provide hole carriers with sufficient energy to surmount the barrier height of the insulator. Therefore, the SHHI is shut off in this situation. Notably, similar effect is observed on the potential of the floating gate $V_{FG}$ 104, where $V_{FG}$ 104 is increased as increasing $V_{NW}$. In other words, without p-Inversion layer in presence, $V_{NW}$ can be capacitively coupled into FG 60. This effect pushes FG-FET 76 further away from inversion mode, and hence shut off SHHI more effectively.

It is thus clear that the second p-Inversion layer 84a plays a critical role on SHHI. Therefore, it is desirable to maintain such p-Inversion layer through out the erase operation of memory cell 300 of the present invention. A second criterion on SHHI thus can be further provided. This is by maintaining the second p-Inversion layer in presence in the channel of FG-FET 76. Therefore, the criterion can be expressed, to first order, in following formula:

$$[Q_{FG}/C_{total}-(1-CR_{SF}-CR_{DF})V_{SL}]<V_T.$$

where $CR_{SF}$, $CR_{DF}$ is the coupling ratio of source to FG and drain to FG, respectively;

$Q_{FG}$ is the charges stored on FG, and is a negative value when FG-FET is in a program state;

$C_{total}$ is the total capacitance.

Therefore, based on the formula, it is desirable that $V_{SL}$ 102 (and $V_{BL}$ 93) be set at a voltage within a level of about 0 V to about +0.4 V that is high enough to keep the channel inverted and yet low enough to avoid forward biasing the p+ region. At a minimum of this consideration, $V_{SL}$ can be typically chosen at 0 V for design convenience. It is further desired to use FG-FET with a low value on the absolute value of $V_T$ ("|$V_T$|"). A good candidate is the so-called "native FET", where |$V_T$| can be in the range of about 0 V to about 0.1 V. Notably, a native p-FET is not available in the conventional CMOS. However, it is possible to realize FG-FETs with lower |$V_T$| in the conventional CMOS process by a proper selection on length and/or width of the transistor channel 84. For example, FET with a shorter channel length usually has a lower |$V_T$| due to the Drain-Induced-Barrier-Lowering (DIBL) effect well-known in the arts. Likewise, FET with a narrower channel width in a STI-based CMOS process can also have a lower |$V_T$| due to the Inverse-Narrow-Width effect well-known in the arts. Moreover, it is further desired to use FG-FET with low body effect to avoid unduly increase on |$V_T$| when $V_{NW}$ 96 is different from $V_{SL}$ 102.

For a programmed cell, the typical value for $Q_{FG}/C_{total}$ can be in the range of about −1.5 V to about −2.5 V. Therefore, setting $V_{SL}$ at about 0 V is adequate to meet the second criterion for an effective erase operation. Needs on a control gate for voltage steering (to lower $V_{FG}$) is not necessary for operating cell of the present invention.

It should be clear to those of ordinary skill in the art that the teaching of these criteria and the analysis described herein can be applied to modify the formula to include coupling effect from other terminals, such as control gate etc. In other words, though not illustrated in the cell structure 300, a control gate can be further added into the cell of the present invention as needed.

An example on bias conditions is shown in FIGS. 4A and 4B for the erase operation of the cell 300. The biases are: 0 V for $V_{BL}$ 93 (applied to BL or region 70), −2.5 V for $V_{SG}$ 92 (applied to SG 62), +5.6 V for $V_{INJ}$ 95 (applied to the diffusion 86 of injector 64), +5 V for $V_{NW}$ 96 (applied to n-Well 68), and 0 V for $V_{SL}$ 102 (applied to SL or region 78). The substrate 90 is held at ground potential.

One of the unique features provided in the erase operation of the present invention is that there is no high voltage across the insulator 91 under FG 60. This can be better illustrated by referring to FIGS. 5A and 5B. As illustrated in FIG. 5A, the surface potential is "pinned" at a same level for various $V_{NW}$. Therefore, the voltage drop across the insulator is determined by the voltage of p-Inversion (hence by $V_{SL}$ when channel of FG-FET is inverted) and by $V_{FG}$. In the example shown here, this voltage drop is in the range of about 1.5 V to about 2 V. This voltage corresponds to a maximum stress field in the insulator at a level of about 2 MV/cm, assuming the insulator is with a thickness of about 100 Å. Notably, the voltage drop across the insulator is much lower in FIG. 5B than in FIG. 5A as a portion of $V_{NW}$ is now coupled into $V_{FG}$ when p-Inversion disappeared. Therefore, the maximum field through out the erase operation of the present invention is much lower than the stress field typically seen when the Fowler-Nordheim mechanism is employed as the erase method (e.g. in U.S. published application Ser. No. 2004/0061168 A1).

Figure 6:
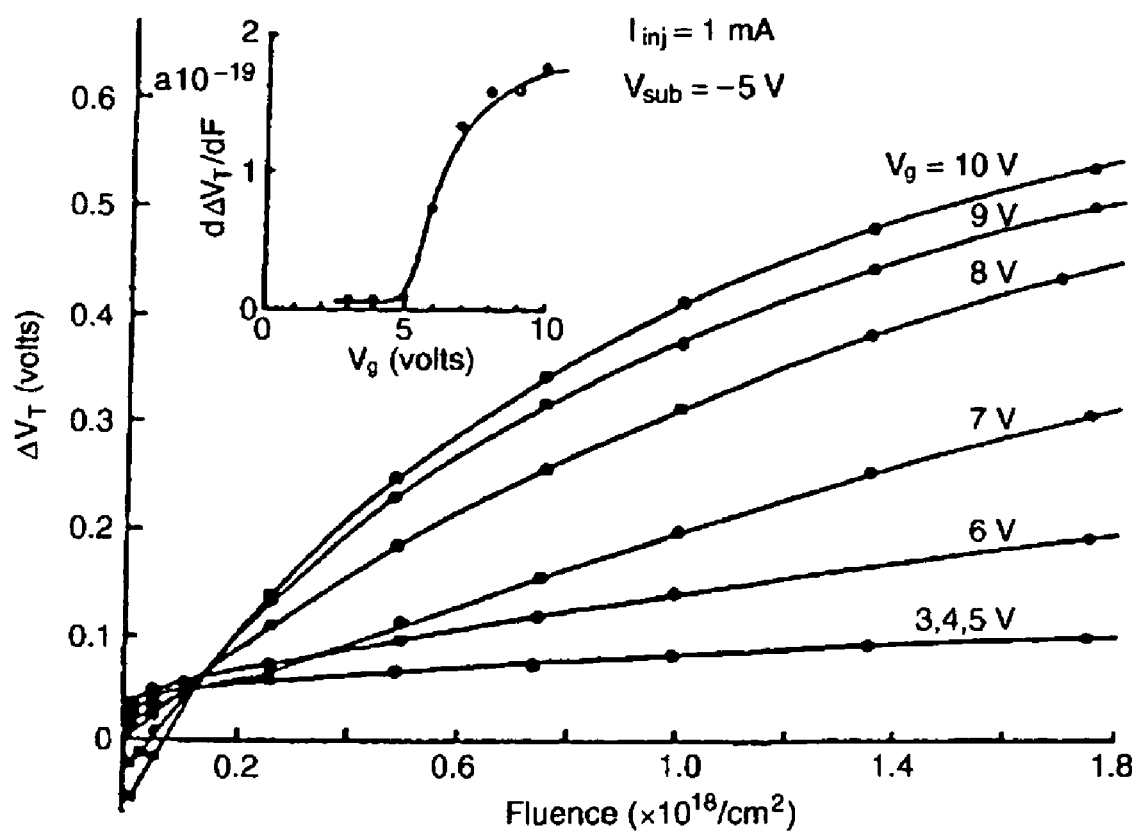
FIG. 6 is a chart illustrating the shift of threshold voltage due to stress field effect.

The ability on keeping a low stress field on the insulator, as provided in the present invention, further provides advantage on suppressing the shift on $V_T$ ($\Delta V_T$). It is well-known that $V_T$ of FG-FET can be shifted from initial level after memory cell received enough program and erase cycles. The shift level of $\Delta V_T$ is known sensitive to the stress field across the insulator (see Nishida et al, "Oxide field and temperature dependent gate oxide degradation by substrate hot electron injection", Proc. IRPS, p. 310, 1991.). FIG. 6 illustrates an example on a chart in the noted article. It can be clearly seen that $\Delta V_T$ can be significantly reduced to a level below 0.1 V as the stress voltage across insulator is confined to a lower range that is below 5 V. Furthermore, it is illustrated in FIG. 6 that $\Delta V_T$ in this lower range of voltage is insensitive to the amount of charge carriers flow through the insulator.

Self-Limiting Erase Method on Memory Cell Operation

Description on the self-limiting mechanism of the erase operation and its usage on cell design and cell operation to prevent over-erase issue will now be provided.

Figure 7A:
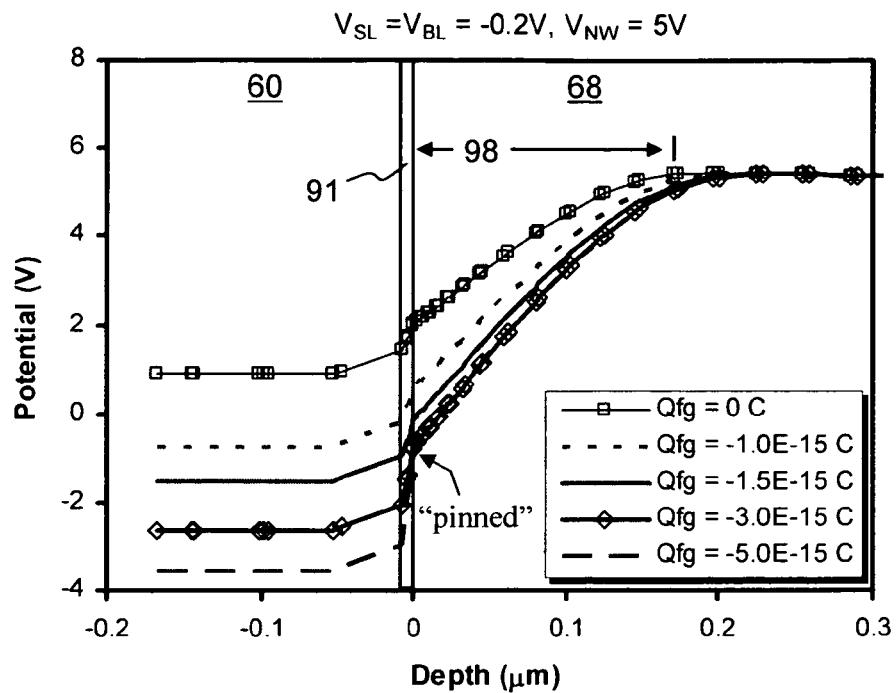
FIG. 7A illustrates the potential along the trajectory of hole movement in FIG. 4B for cell at various states of $Q_{FG}$ in the erase operation of the present invention.
Figure 7B:
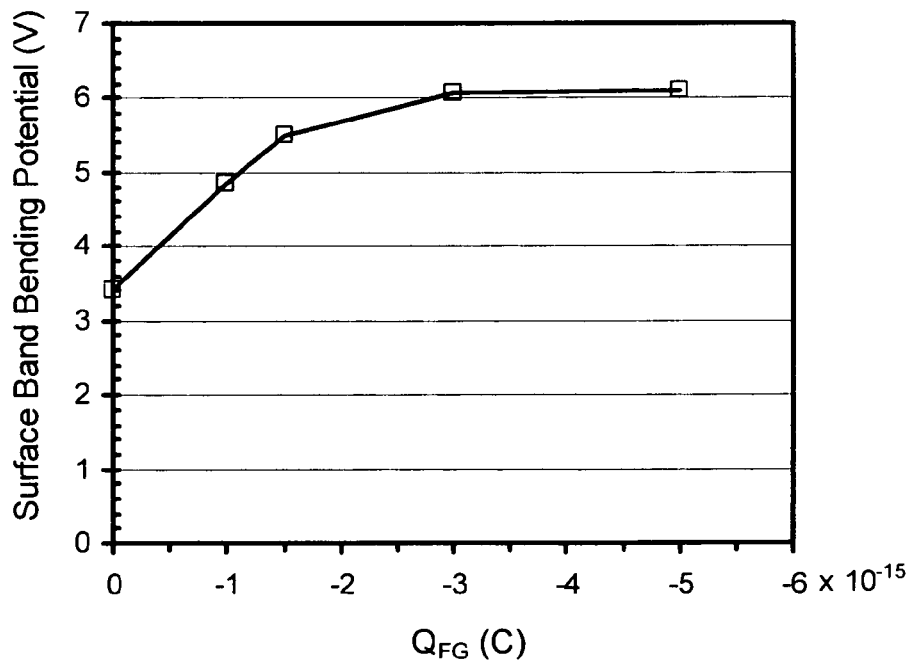
FIG. 7B illustrates the band bending of the surface potential versus various states of $Q_{FG}$ during the erase operation of the memory cell of the present invention.

During the erase operation on memory cell 300, as SHHI continues, the negative charges on the FG are neutralized, and the value $Q_{FG}/C_{total}$ can increase to a range where the second p-Inversion layer starts disappearing. FIG. 7A provides the simulation result on potential along line 99a in FIG. 4B for cell 300 under bias conditions of $V_{SL}=V_{BL}=-0.2V$ and $V_{NW}=5V$. The results in FIG. 7A are to illustrate the evolution of changes on potential along the evolution of changes on $Q_{FG}$. The evolution of the erase process starts at $Q_{FG}=-5\times10^{-15}$ Coulomb (C) and ends at $Q_{FG}=0$ C. At the early stage of the erase process (i.e. curves corresponding to $Q_{FG}=-5\times10^{-15}$ and $-3\times10^{-15}$ C), the surface potentials of the two cases are shown "pinned" at a same level of about −1 V. As SHHI continue, $Q_{FG}$ is increased accordingly and eventually increased beyond a level where the second p-Inversion layer disappears. As a result, the surface potential moves away from the "pinned" level to follow the movement of $Q_{FG}$, hence the movement of $V_{FG}$. This movement on surface potential changes the band bending of potential in the SCR 98 dramatically. Illustrated in FIG. 7B is the band bending of the potential in SCR 98 plotted versus various $Q_{FG}$ stored on the floating gate. As SHHI continue, $Q_{FG}$ can increase from $-5\times10^{-15}$ C to 0 C. This results in the band bending to decrease from its initial value (about 6V) to a level below the hole barrier height, thus shutting off the SHHI process itself. This effect provides a self-limiting mechanism to the erase operation of the present invention. This mechanism can prevent the FG from being converted to an unduly positively charged state, thus prevents cell 300 of the present invention from being over-erased.

Over-erase issue is well-known in the art. It leads difficulties on programming a p-FET based memory cell when employing ICHE for the operation. For an over-erased p-FET cell, the channel hole current can be so low such that it prohibits the cell from being programmed by using ICHE mechanism (see Chris Diorio, "A p-Channel MOS Synapse Transistor with Self-Convergent Memory Writes," IEEE Trans. Electron Devices, vol. 47, pp. 464-472, 2000). As described in the noted article, the over-erase issue in p-FET based cell can be prevented by employing complicate algorithm to initialize this type of memory cell through trimming cell current to a low level typically in the range of about 100 nA. This algorithm on trimming the cell current is however not required in memory cell of the present invention. This can be better illustrated by referring to the second criterion described hereinbefore. Assuming $V_{SL}=0$ V for simplicity on illustration, the SHHI ends as $V_{FG}$ ($=Q_{FG}/C_{total}$) approximately equals $V_T$. Therefore, during the erase operation of the cell of the present invention, the FG-FET starts in inversion mode and ends in sub-threshold mode at the end of the erase operation. As a result, the cell never got over-erased. In fact, it is maintained at sub-threshold level where cell channel current can be in the range of about 100 nA to about 300 nA. Different from the memory cell in the noted article, there is no special algorithm on cell operation is required in the present invention to achieve this level of cell current for preventing the over-erase issue.

The method on erase operation provided in the present invention has the advantages on high injection efficiency for the erase carriers, self-limiting feature on erase, and immunity from the over-erase issue. Additionally, it permits cell structure and layout that can be implemented in the conventional CMOS process. Furthermore, it does not require a control gate, thus small cell size is achievable. Moreover, there is no high field stress ever appear to the storage insulator, thus the erase method avoids retention failure caused by SILC effect.

The program operation of the present memory cell can be done by employing the ICHE in similar way as that described in the prior art. The cell is programmed by first forming an inversion layer of hole carriers in the channel. The source and drain of FG-FET is biased in such a way that the channel hole carriers are accelerated by the electric field between them with a portion of the holes heated up to generate secondary electrons. These electrons can have energy higher than the barrier height of the insulator and hence can make their way entering FG and stored therein. An example on biases for programming the cell is: −3.3 V (applied to SL), +2.0 V (applied to SG), +3.3 V (applied to BL), and +3.3 V (applied to n-Well). The injector is left floating in this operation.

The read operation of the memory cell 300 is described with reference to regions in FIG. 3. A voltage of about +0.5 V to about +3.3 V can be applied to the source region 79 of FG-FET 76. A read voltage of approximately 0 V is applied to the drain 71 of the SG-FET 72 and approximately 0 V is applied to its SG 62. Such bias condition turns on the channel 82 of the SG-FET. This way, the voltage at the drain 71 of the SG-FET 72 is passed on to the drain 74b of the FG-FET 76. The p+ region 86 of the injector 64 and the n-Well 68 are at a same voltage in the range of about +0.5 V to about +3.3 V. A ground potential is applied to the substrate. If the floating gate 60 is negatively charged (i.e. the floating gate is charged of electrons), then the channel region 84 of the FG-FET 76 is strongly turned on. Thus, a high electrical current will flow from the source region 79 to the drain region 71. This would be the "1" state. On the other hand, if the floating gate 60 is discharged of electrons, the channel region 84 cannot be strongly turned on, and hence the FG-FET 76 is either weakly turned on or is entirely shut off. Even when SG 62 and the drain region 71 are biased at the read potential, little or no current will flow through the channel 82 of SG-FET 72. In this case, either the current is very small compared to that of the "1" state or there is no current at all. In this manner, the memory cell is sensed to be programmed at the "0" state.

The memory cell can be formed in an array with peripheral circuitry including conventional row address decoding circuitry, column address decoding circuitry, sense amplifier circuitry, output buffer circuitry and input buffer circuitry, which are well known in the art.

It is to be understood that the present invention is not limited to the illustrated herein and embodiments described above, but encompasses any and all variations falling within the scope of the appended claims. For example, although the present invention is illustrated in memory cell programmed with ICHE, it should be apparent to those having ordinary skill in the art that it can be extended to any other type of mechanism for programming the memory cell of the present invention (such as Drain-Avalanche Hot-Carrier Injection, or BTBT injection mechanism). Furthermore, the present invention is illustrated in non-volatile memory cell storing charges on a storage region of a conductive or semiconductor material (i.e. the "floating-gates") that is electrically insulated from but capacitively coupled to surrounding electrodes. In such storage scheme, charges are evenly distributed through out the conductive region. However, it should be apparent to those of ordinary skill in the art that the present invention is not limited to the illustrated herein and embodiments described above, but can encompass any other type of schemes for storing charges. For example, the memory cells of the present invention can store charges in localized storage sites such as silicon nano-crystals or of traps in a dielectric layer. Further, although the present cell is illustrated to comprise the FG-FET and SG-FET, it should be apparent to those of ordinary skill in the art that the cell operation can be performed without the SG-FET in the cell. Additionally, although the present invention is illustrated in a single cell, it should be apparent to those of ordinary skill in the art that a plurality of cells of the present invention can be arranged in a rectangular array of rows and columns, wherein the plurality of cells are constructed in NOR or NAND array architecture well-known in the art. The erase operation of the array thus constructed can be done in a small group of such cells (e.g. cells storing a digital word, which contains 8 cells) for byte erase. Additionally, the erase can be done in large group of cells (e.g. cells storing code for software program, which can contains 2048 cells configured in page, or contains a plurality of pages in block in the array architecture).

Moreover, the floating gate (or the storage region) of the present invention need not be in rectangular shape in their top view, need not be in rectangular in their cross-sections, but rather can be any size and shape in their top view and in their cross-sections that effectively store charges and effectively connects the drain and source regions of the FG-FET in each memory cell. Likewise, the source and drain regions need not be in rectangular shape in their top view, need not be in rectangular in their cross-sections, but rather can be any size and shape in their top view and cross-sections. Similarly, the injector region need not be in rectangular shape in their top view, need not be in rectangular in their cross-sections, need not be placed side-by-side with FG-FET, need not be isolated from the FG-FET channel by field oxide, but rather can be any size and shape in their top view and cross-sections, placed in any location, isolated from the FG-FET in any scheme that effectively supply hole carriers for SHHI. Additionally, the top surface portion of the storage region need not be co-planar with the substrate surface, but rather can be at any level under or above the substrate surface that permit the storage region to effectively store charges, effectively capacitive-coupled with the body, and effectively connects the drain and source regions in each memory cell. Similarly, the bottom surface portion of the storage region need not be parallel to the substrate surface, need not be flat, but rather can be with other shape that permit storage region to effectively store charges, effectively capacitive-coupled with the body, and effectively connects the drain and source regions of the FG-FET in each memory cell. Additionally, the surface of the channel region need not be co-planar with the substrate surface, but rather can be at any level under or above the substrate surface or in any angle with the substrate surface that effectively connects the drain and source regions of the FG-FET in each memory cell. Further, the drain of the FG-FET need not be sharing a same diffusion with the source of the SG-FET, need not be placed side-by-side with the source of the SG-FET, but rather can be placed in its own diffusion, in any location that can be electrically connected to the source of the SG-FET. Moreover, source and drain regions, and source lines and bit lines, can be swapped. It should be understood that while the figures show the substrate uniformly doped, it is well known that any and/or all of the regions formed therein (source, drain, channel region, body region, etc.) can be formed in one or more well regions (of differently doped silicon).

What is claimed is:

1. A method of operating a memory cell of an electrically erasable and programmable nonvolatile memory device, the memory device comprising at least one memory cell, each memory cell having a substrate of semiconductor material of a p-type conductivity, a well of an n-type conductivity in the substrate, a storage transistor comprising a source and a drain formed in the well and having the p-type conductivity, a channel of the well between the source and the drain, and a charge storage region disposed over and insulated from the channel by an insulator, and an injector having a p-type region disposed adjacent to and isolated from the channel, the method comprising the steps of:
applying a first voltage to the p-type region of the injector;
applying a second voltage to the well; and
applying a third voltage to at least one of the source and the drain to form an inversion layer in the channel;
wherein the first voltage is sufficiently more positive with respect to the second voltage and the second voltage is sufficiently more positive with respect to the third voltage to injected holes from the injector to transport through the well, through the channel and through the insulator onto the charge storage region.

2. The method of claim 1, further comprising the steps of:
applying a fourth voltage to the well;
applying a fifth voltage to the source; and
applying a sixth voltage to the drain;
wherein the sixth voltage is sufficiently more negative with respect to the fourth voltage to inject electrons from the channel through the insulator onto the charge storage region.

3. The method of claim 1, wherein the third voltage is higher than a voltage of the charge storage region by at least a threshold voltage of the storage transistor.

4. The method of claim 1, wherein the first and the second voltages are positive voltages and the third voltage is a ground voltage.

5. A method of operating a memory cell of an electrically erasable and programmable nonvolatile memory device, the memory device comprising at least one memory cell, each memory cell having a substrate of semiconductor material of a p-type conductivity, a well of an n-type conductivity in the substrate, a storage transistor comprising a source and a drain formed in the well and having the p-type conductivity, a channel of the well between the source and the drain, and a charge storage region disposed over and insulated from the channel by an insulator, and an injector having a p-type region disposed adjacent to and isolated from the channel, the method comprising the steps of:
erasing the memory cell by:
applying a first voltage to the p-type region of the injector;
applying a second voltage to the well; and
applying a third voltage to at least one of the source and the drain to form an inversion layer in the channel;
wherein the first voltage is sufficiently more positive with respect to the second voltage and the second voltage is sufficiently more positive with respect to the third voltage to inject holes from the injector to transport through the well, through the channel and through the insulator onto the charge storage region; and
programming the memory cell by:
applying a fourth voltage to the well;
applying a fifth voltage to the source; and
applying a sixth voltage to the drain;
wherein the sixth voltage is sufficiently more negative with respect to the fourth voltage to inject electrons from the channel through the insulator onto the charge storage region.

6. The method of claim 5, wherein the third voltage is higher than a voltage of the charge storage region by at least a threshold voltage of the storage transistor.

7. The method of claim 5, wherein the first and the second voltages are positive voltages and the third voltage is a ground voltage.

8. The method of claim 1, wherein the storage transistor has a hole baffler height between the insulator and the well, and wherein the product of a unit charge and a voltage difference between the second and third voltages is about the hole baffler height or greater.

9. The method of claim 8, wherein the insulator is an oxide and the voltage difference is in a range of about 4 V to about 6 V.

10. The method of claim 1, wherein the memory cell and the voltages provide a self-limiting mechanism to prevent holes from being over injected onto the charge storage region, thereby preventing over-erase of the memory cell.

11. The method of claim 5, wherein the storage transistor has a hole baffler height between the insulator and the well, and wherein the product of a unit charge and a voltage difference between the second and third voltages is about the hole barrier height or greater.

12. The method of claim 11, wherein the insulator is an oxide and the voltage difference is in a range of about 4 V to about 6 V.

13. The method of claim 5, wherein the memory cell and the voltages for erasing the memory cell provide a self-limiting mechanism to prevent holes from being over injected onto the charge storage region, thereby preventing over-erase of the memory cell.

14. A method operating a memory cell of an electrically erasable and programmable nonvolatile memory device, the memory device comprising at least one memory cell, each memory cell having a substrate of semiconductor material of a p-type conductivity, a well of an n-type conductivity in the substrate, a storage transistor comprising a source and a drain formed in the well and having the p-type conductivity, a first channel of the well between the source and the drain, and a charge storage region disposed over and insulated from the first channel by a first insulator, an injector having a p-type region disposed adjacent to and isolated from the first channel, and a select transistor having a select source and a select drain of the p-type conductivity and formed in the well with a second channel of the well defined therebetween, a select gate disposed over and insulated from the second channel by a second insulator, wherein the first select source of the select transistor is electrically connected to the drain of the storage transistor, and the method comprising the steps of:

applying a first voltage to the p-type region of the injector;
applying a second voltage to the well; and
applying a third voltage to at least one of the source and the drain to form a first inversion layer in the first channel;
wherein the first voltage is sufficiently more positive with respect to the second voltage and the second voltage is sufficiently more positive with respect to the third voltage to inject holes from the injector to transport through the well, through the first channel and through the first insulator onto the charge storage region.

15. The method of claim 14, wherein the third voltage is higher than a voltage of the charge storage region by at least a threshold voltage of the storage transistor.

16. The method of claim 14, farther comprising the step of:

applying a fourth voltage to the select gate; and
applying a fifth voltage to the select drain;
wherein the fourth voltage is lower than the fifth voltage by at least a threshold voltage of the select transistor to form a second inversion layer in the second channel.

17. The method of claim 16, wherein the storage transistor has a hole barrier height between the first insulator and the well, and wherein the product of a unit charge and a voltage difference between the second and fifth voltages is about the hole baffler height or greater.

18. The method of claim 17, wherein the first insulator is an oxide and the voltage difference is in a range of about 4 V to about 6 V.

19. The method of claim 14, wherein the storage transistor has a hole barrier height between the first insulator and the well, and wherein the product of a unit charge and a voltage difference between the second and third voltages is about the hole baffler height or greater.

20. The method of claim 19, wherein the first insulator is an oxide and the voltage difference is in a range of about 4 V to about 6 V.

21. The method of claim, 14 wherein the memory cell and the voltages provide a self-limiting mechanism to prevent holes from being over injected onto the charge storage region, thereby preventing over-erase of the memory cell.

22. The method of claim 14, further comprising the steps of:

applying a sixth voltage to the well;
applying a seventh voltage to the source;
applying a eighth voltage to the select drain; and
applying a ninth voltage to the select gate;
wherein the seventh voltage is sufficiently more negative with respect to the sixth voltage to inject electrons from the first channel through the first insulator onto the charge storage region.

23. The method of claim 22, wherein the ninth voltage is lower than the eighth voltage by at least a threshold voltage of the select transistor to form a second inversion layer in the second channel.

* * * * *